United States Patent [19]

Murakami et al.

[11] Patent Number: 5,072,295
[45] Date of Patent: Dec. 10, 1991

[54] ADAPTIVE QUANTIZATION CODER/DECODER WITH LIMITER CIRCUITRY

[75] Inventors: Tokumichi Murakami; Yoshiaki Kato; Hideo Ohira, all of Kanagawa, Japan

[73] Assignee: Mitsubishi Denki Kabushiki Kaisha, Tokyo, Japan

[21] Appl. No.: 569,927

[22] Filed: Aug. 20, 1990

[30] Foreign Application Priority Data

Aug. 21, 1989 [JP] Japan .................................. 1-215233

[51] Int. Cl.$^5$ .............................................. H04N 7/13
[52] U.S. Cl. ..................................... 358/136; 358/135
[58] Field of Search .................. 358/136, 135; 375/27, 375/122

[56] References Cited

U.S. PATENT DOCUMENTS

| | | | |
|---|---|---|---|
| 4,636,856 | 1/1987 | Starck | 358/135 |
| 4,743,967 | 5/1988 | Takenaka et al. | 358/136 |
| 4,891,698 | 1/1990 | Mattausch et al. | 358/136 X |
| 4,893,184 | 1/1990 | Mattausch et al. | 358/136 X |

Primary Examiner—Victor R. Kostak
Attorney, Agent, or Firm—Wolf, Greenfield & Sacks

[57] ABSTRACT

An adaptive quantization coder/decoder having a limiter in a quantization coding module so that a reconstruction value of a quantization level is not in excess of a predetermined allowable range, or providing a limiter in a local quantization decoding module so that an output signal level falls within a predetermined allowable range, or providing a limiter in a quantization decoding module so that the output signal level falls within the predetermined allowable range.

6 Claims, 8 Drawing Sheets

WHEN THE QUANTIZATION STEP-SIZE g=32

WHEN THE QUANTIZATION STEP-SIZE g=30

ADAPTIVE QUANTIZATION CODER/DECODER WITH LIMITER CIRCUITRY

BACKGROUND OF THE INVENTION

The present invention is directed to a quantizer for compressing an amount of information of digital signals and also to a coder/decoder employing this quantizer.

Referring to FIG. 5, there is illustrated a prior art adaptive quantization coder/decoder reported in, e.g., [A Proposal of Coding Control Method for MC.DCT Coding Scheme] written by Kato et al (The National Convention of Information and Systems Group; The Institute of Electronic, Information and Communication Engineers, 1987). In FIG. 5, the numeral 1 designates a subtracter; 2 a transform unit; 3 a quantization coder; 4 a coding unit; 5 a quantization decoder; 6 an inverse transform unit; 7 an adder; 8 a frame memory; 9 an adaptive coding control unit; 10 a transmission channel; and 11 a decoding unit.

Operations of the system depicted in FIG. 5 will next be described. On the transmitting side, a difference signal between a digitized input image signal 100 and a predictive signal 101 which is a previous frame signal of the frame memory 8 is obtained by the subtracter 1. The thus obtained difference signal is defined as a predictive error signal 102. The predictive error signal 102 is transformed into a transform coefficient 103 of a frequency domain in the transform unit 2 by a transform function such as, e.g., a discrete cosine transform. The transform coefficient 103 is quantized to a discrete level (hereinafter referred to as a quantization level) 105 by the quantization coder 3 in accordance with a quantization step-size 104 provided by the adaptive coding control unit 9. A code is allocated to the quantization level 105 by means of the coding unit 4, as a result of which coded data 106 is transmitted together with information of the quantization step-size 104 to the transmission channel 10. The transform unit 2, the quantization coder 3 and the coding unit 4 are combined to constitute a quantization coding module. A decode transform coefficient 107 is obtained from the quantization level 105 by the quantization decoder 5, employing the quantization step-size 104. The decode transform coefficient 107 undergoes an inverse transform in the inverse transform unit 6 to thereby, obtain a decode predictive error signal 108. A local quantization decoding module is composed of the quantization decoder 5 and the inverse transform unit 6 on the transmitting side. The decode predictive error signals 108 is added to the predictive signal 101 by the adder 7. The added value is held as a local decode signal 109 in the frame memory 8 to be used as a predictive signal 101 of the next frame.

On the other hand, coding data 110 transmitted via the transmission channel 10 is decoded to a quantization level 111 by the decoding unit 11 on the receiving side. A decode transform coefficient 112 is obtained from the quantization level 111 by means of the quantization decoder 5, employing the quantization step-size 104 given from the decoding unit 11. The decode transform coefficient 112 undergoes an inverse transform in the inverse transform unit 6, thus acquiring a decode predictive error signal 113. A quantization decoding module consists of the decoding unit 11, the quantization decoder 5 and the inverse transform unit 6 on the receiving side. The decode predictive error signal 113 is added to a predictive signal 114 by the adder 7. The thus added signal is outputted as a decode signal 115 and at the same moment held in the frame memory 8 to be used as a predictive signal 114 of the next frame.

The quantization coder 3 for effecting the quantization as the quantization step-size 104 is adaptively controlled will hereinafter be described. Each dynamic range of the digitized input image signal 100 and the predictive signal 101 is from 0 to 255, i.e., 8 bits. In this case, the dynamic range of the predictive error signal 102 is from −255 to 255, viz., 9 bits (1 bit of which is a sign bit). The 9 bit predictive error signal 102 is arranged in (8×8) blocks and transformed into the transform coefficient 103 of the frequency domain of a 2 dimensional discrete cosine transform. In consequence of this, the dynamic range of the transform coefficient 103 ranges from −2048 to 2047, i.e., 12 bits (1 bit of which is a sign bit). Hence, the dynamic ranges of the input signal to the quantization coder 3 and of the output signal from the quantization decoder 5 are from −2048 to 2047. It is now assumed that a characteristic of the quantizer is defined, for simplicity, as a linear quantization characteristic of a mid-tread type wherein the quantization step-size shown in the following formula (1) is constant at all the decision levels.

$$q_{dec}(n) = (|n| \times g) \times n/|n|$$

$$q_{rep}(n) = \frac{1}{2}\{q_{dec}(n) + q_{dec}(n + n/|n|)\}$$

$$q_{rep}(O) = 0 \qquad (1)$$

where $q_{dec}(n)$ is the decision level, $q_{rep}(n)$ is the reconstruction value, g is the quantization step-size, and n is the quantization index. Here, g is the positive even number. Turning to FIG. 6, there is shown a quantization characteristic in this case. In FIG. 6, the horizontal axis indicates the decision level of the quantizer, while the vertical axis indicates the reconstruction value. For example, when the transform coefficient CO is prescribed such as $3g \leq CO < 4g$, CO is quantized to 3.5 g, and the quantization index, which undergoes a coding transmission, becomes 3. More specifically, as illustrated in FIG. 7, when the quantization step-size g is set to 32, the transform coefficient CO, which is prescribed such as $64 \leq CO < 96$, is quantized to a reconstruction value 80. A magnitude of the quantization step-size corresponds to the fineness of the quantization. The quantization becomes less fine with the increasing quantization step-size g. A difference (quantization error) between the input value and the reconstruction value increases, thereby causing a deterioration in the quality of the decoded image. The dynamic range of the input value is, as discussed above, fixed. Therefore, when the quantization step-size g is large, the dynamic range of the coded quantization index decreases to thereby reduce the amount of information to be transmitted. When the quantization step-size g is, e.g., 16, the dynamic range of the quantization index ranges from −128 to 127. In contrast, when the quantization step-size g is 64, the dynamic range of the quantization index is from −32 to 31. Hence, it is possible to optimize the relationship between the quality of the decoded image and the amount of information to be transmitted by adaptively controlling the quantization step-size g in accordance with the image inputted.

Supposing that the quantization step-size g is varied and set to 30, a quantization characteristic at that time is shown in FIG. 8. Namely, the transform coefficient CO, which is prescribed such as $2040 \leq CO \leq 2047$, is quantized to a reconstruction value 2055. In the case of being negative, the transform coefficient CO, which is prescribed such as $-2048 \leq CO \leq 2040$, is similarly quantized to a reconstruction value $-2055$.

There arises, however, the following problem inherent in the prior art adaptive quantization coder/decoder having the above-described construction. There exists a possibility that the reconstruction value outputted when changing the quantization step-size exceeds an allowable range of inputting at the next stage. For instance, a value-outputted from the quantization decoder in the quantization decoding module rises beyond the allowable range, resulting in a failure of operation.

SUMMARY OF THE INVENTION

Accordingly, it is an object of the present invention, which has been devised to obviate the foregoing problem, to provide an adaptive quantization coder/decoder wherein a reconstruction value to be outputted does not exceed an allowable input range of the next stage, and no operation failure occurs.

The adaptive quantization coder/decoder according to the present invention is characterized by providing a limiter in a quantization coding module so that a reconstruction value of a quantization level is not in excess of a predetermined allowable range, or providing a limiter in a local quantization decoding module so that an output signal level falls within a predetermined allowable range, or providing a limiter in a quantization decoding module so that the output signal level falls within the predetermined allowable range.

The adaptive quantization coder/decoder of the invention is arranged such that the reconstruction value of the quantization level does not exceed the predetermined allowable range by virtue of the limiter provided in the quantization coding module, or alternatively the output signal level falls within the predetermined allowable range by virtue of the limiter provided in the quantization.decoding module.

BRIEF DESCRIPTION OF THE DRAWINGS

Other objects and advantages of the present invention will become apparent during the following discussion taken in conjunction with the accompanying drawings, in which.

DETAILED DESCRIPTION OF THE PREFERRED EMBODIMENTS

Figure 5:
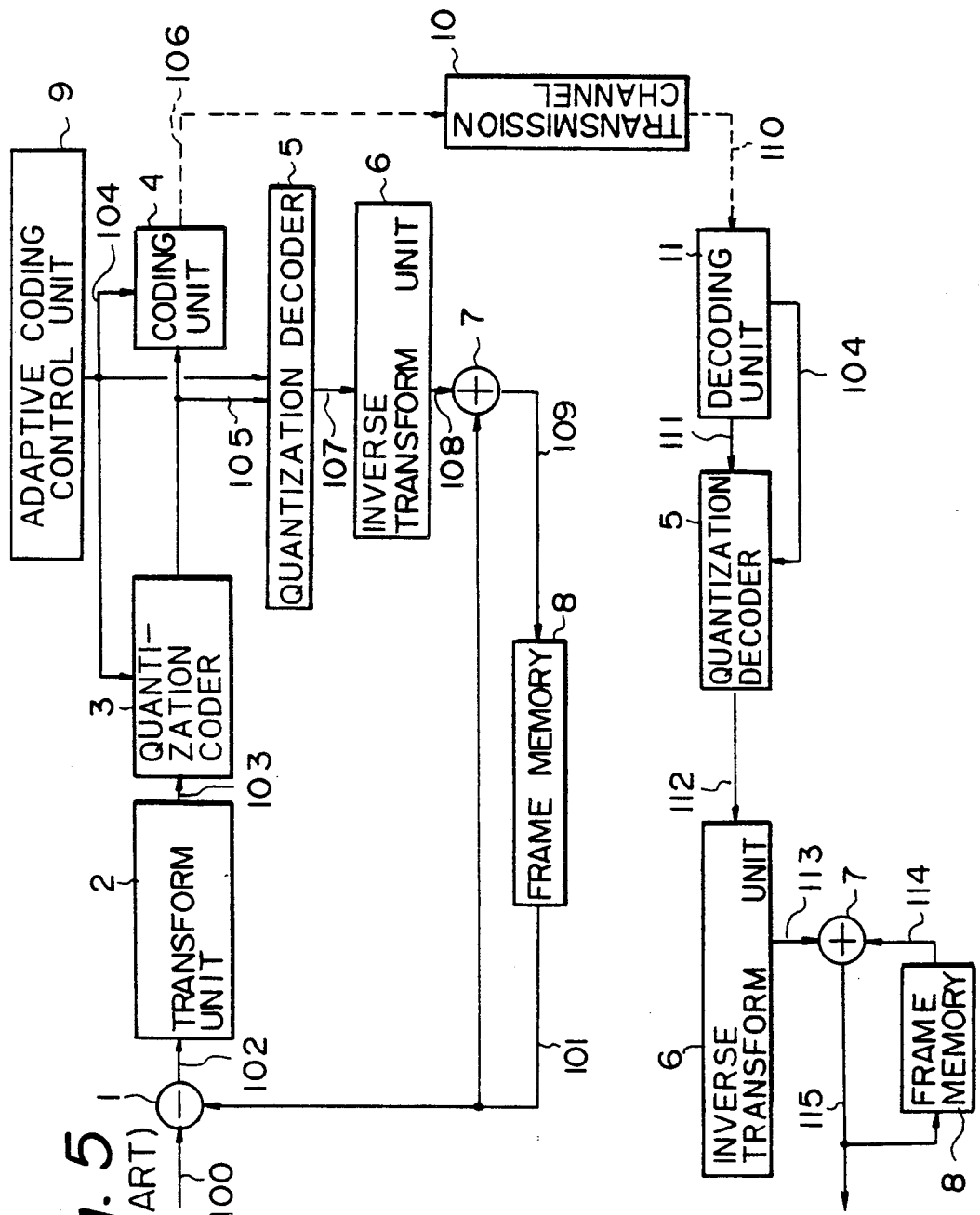
FIG. 5 is a block diagram depicting a prior art adaptive quantization coder/decoder.
Figure 6:
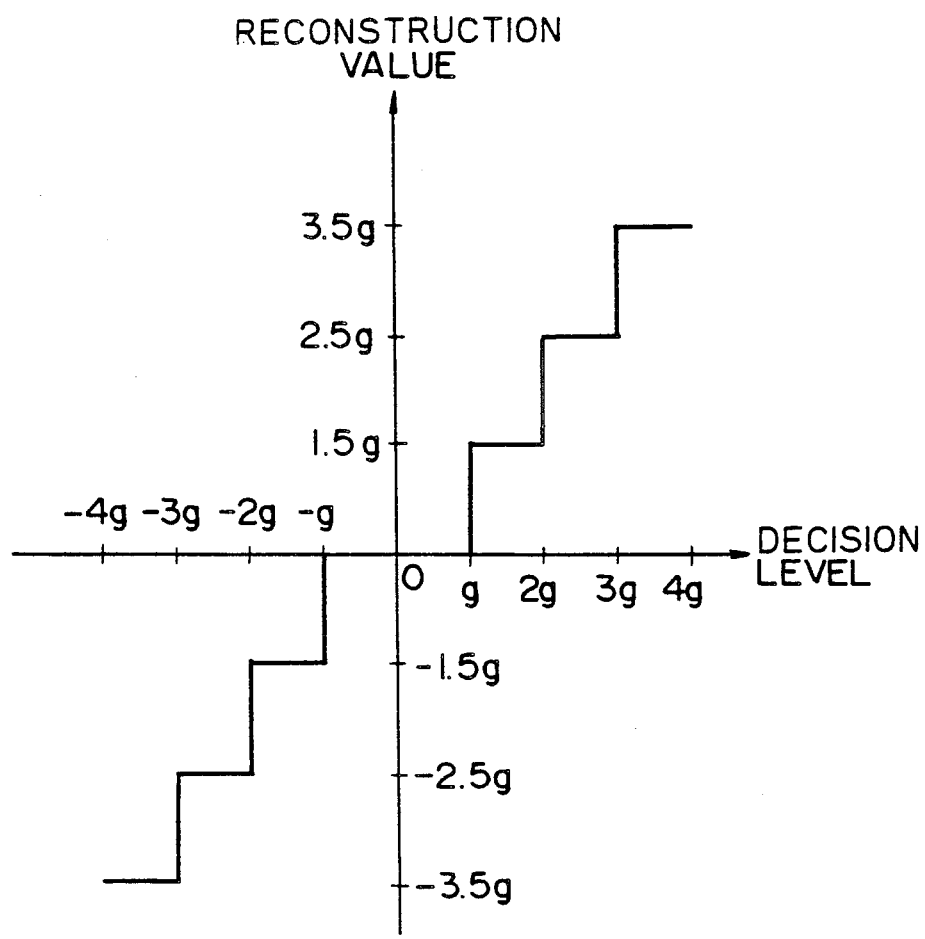
FIG. 6 is a chart of assistance in explaining a quantization characteristic.
Figure 7:
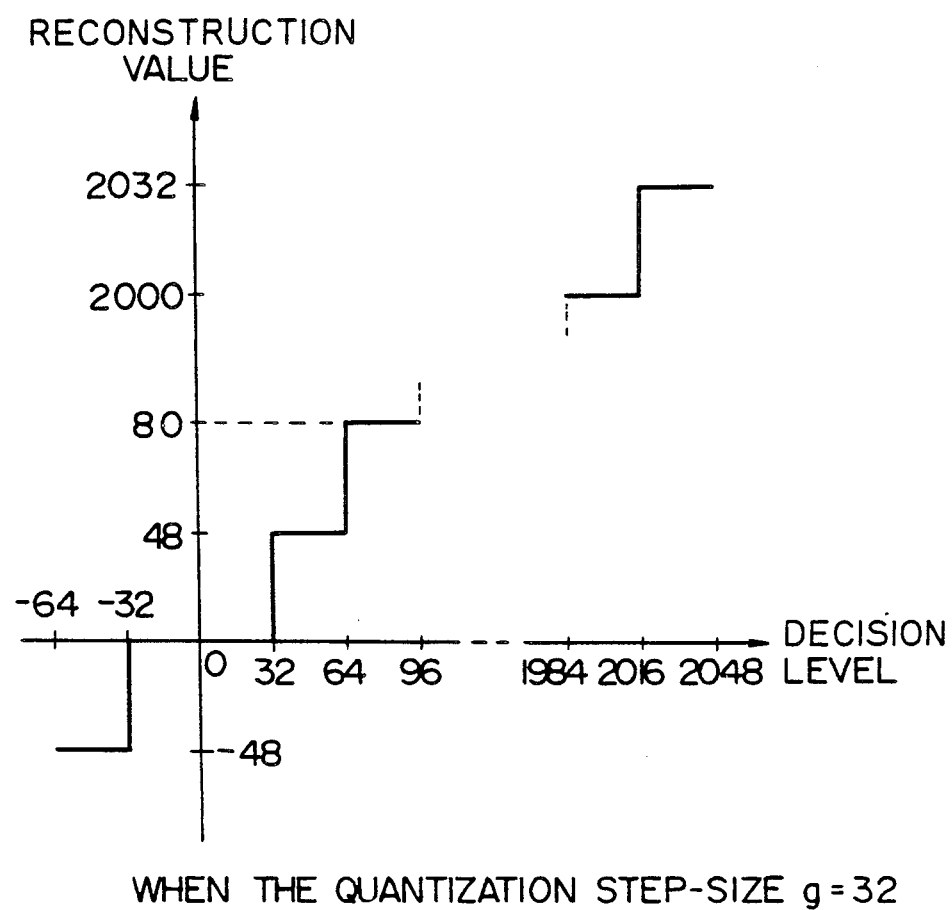
FIGS. 7 and 8 are explanatory charts each showing the quantization characteristic when quantization step-sizes are set to 32, and 30, respectively.
Figure 8:
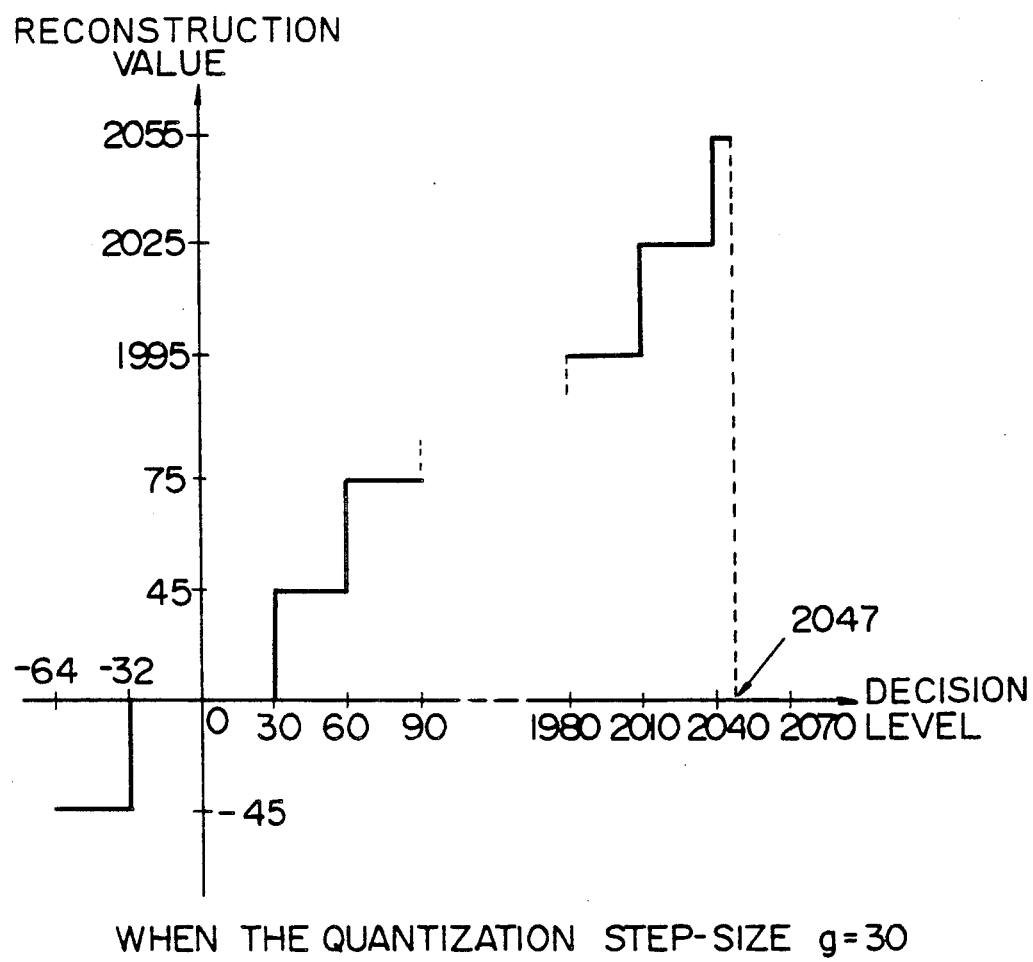

Illustrative embodiments of the present invention will hereinafter be described with reference to the accompanying drawings. In a first embodiment shown in FIG. 1, the numeral 12 represents a limiter A provided in a quantization coding module. Designated at 13 is a limiter B provided in a quantization decoding module. Other components are the same as those depicted in FIG. 5.

Figure 1:
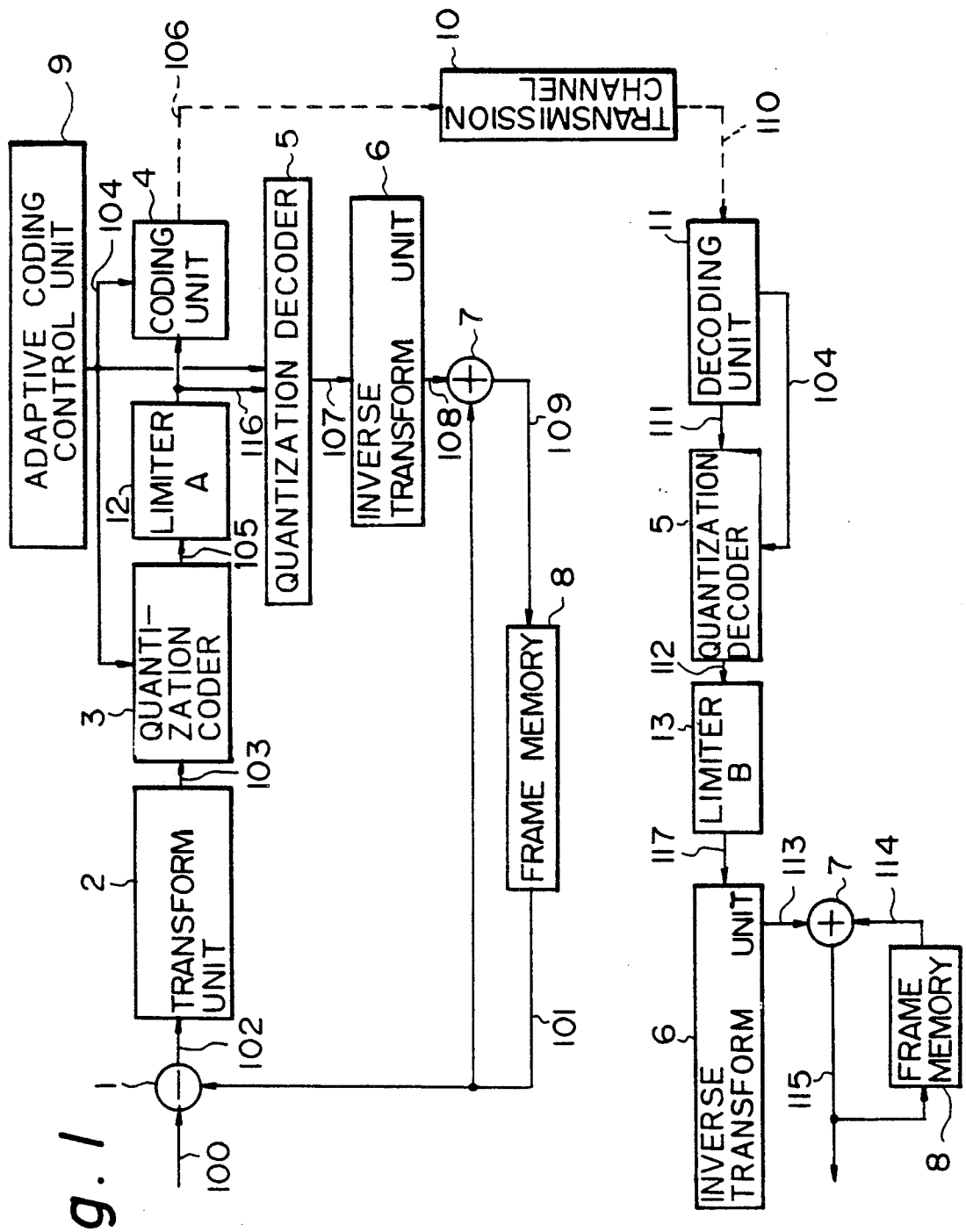
FIG. 1 is a block diagram showing a first embodiment of an adaptive quantization coder/decoder according to the present invention.
Figure 3:
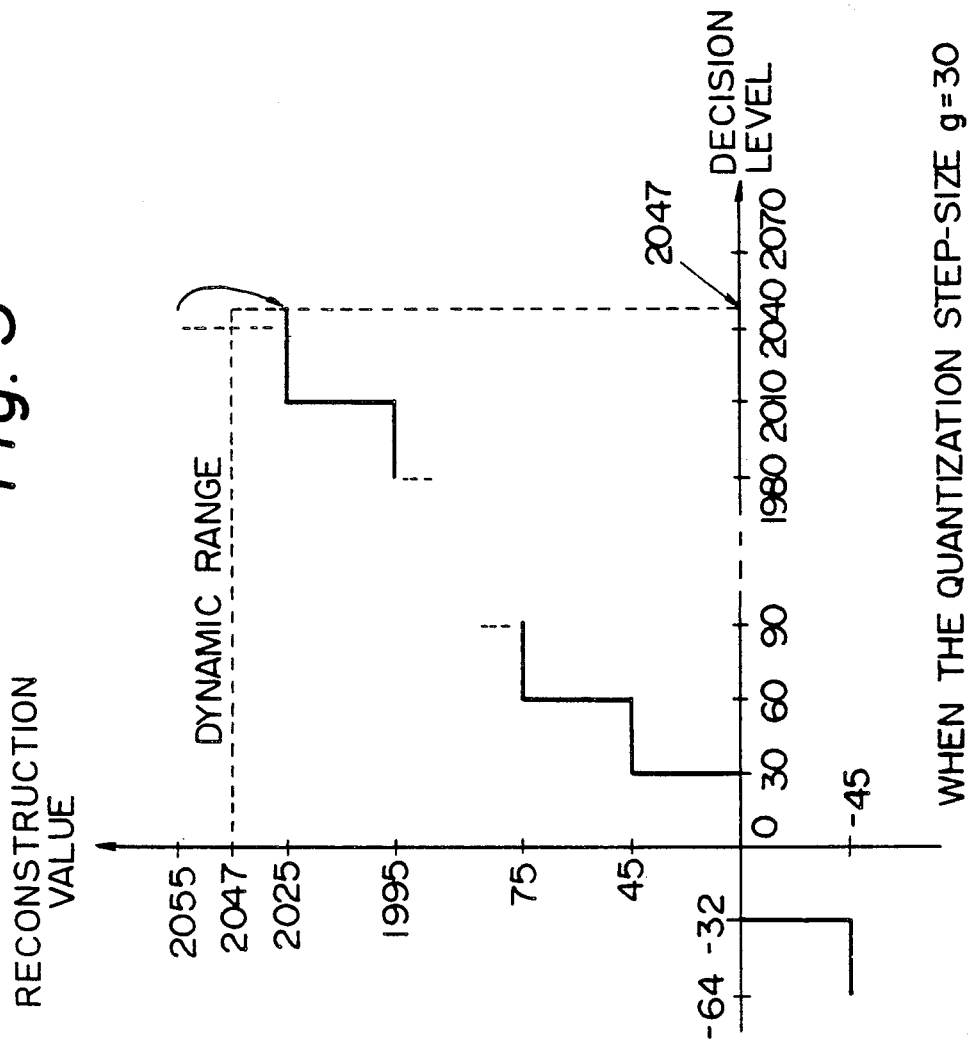
FIG. 3 is a chart illustrating a characteristic of a limiter A provided in a quantization coding module according to the present invention.

An operation of the limiter A of the quantization coding module will be explained referring to FIG. 1. The operation starts by, as in the prior art, quantizing a transform coefficient 103 to a quantization level 105 in a quantization coder 3 by a quantization step-size 104. Next, whether or not a reconstruction value exceeds an allowable dynamic range, herein from $-2048$ to 2047, of an input signal of the next stage is judged from the quantization step-size 104 and the quantization level 105 by means of the limiter A 12. If greater than the dynamic range, there is outputted a quantization level 116 restricted closer by 1 level to the origin. To be specific, as illustrated in FIG. 3, when the quantization step-size g is 30, a transform coefficient ranging from 2010 to 2047 is quantized to 2025. FIG. 3 shows a case where the transform coefficient is positive. In the case of being negative, the transform coefficient ranging from $-2010$ to $-2048$ is likewise quantized to $-2025$.

Figure 2:
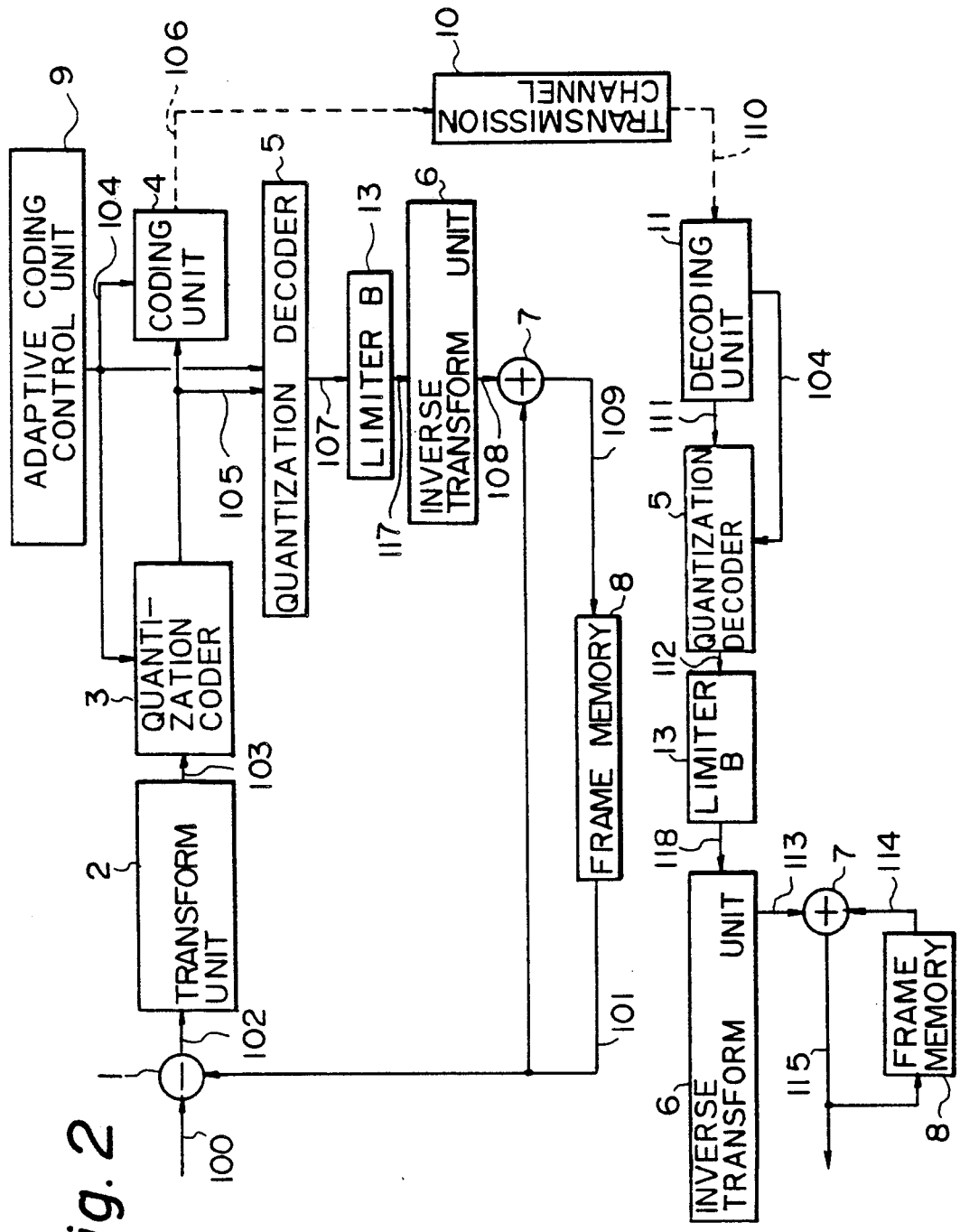
FIG. 2 is a block diagram showing a second embodiment of the adaptive quantization coder/decoder of the invention.
Figure 4:
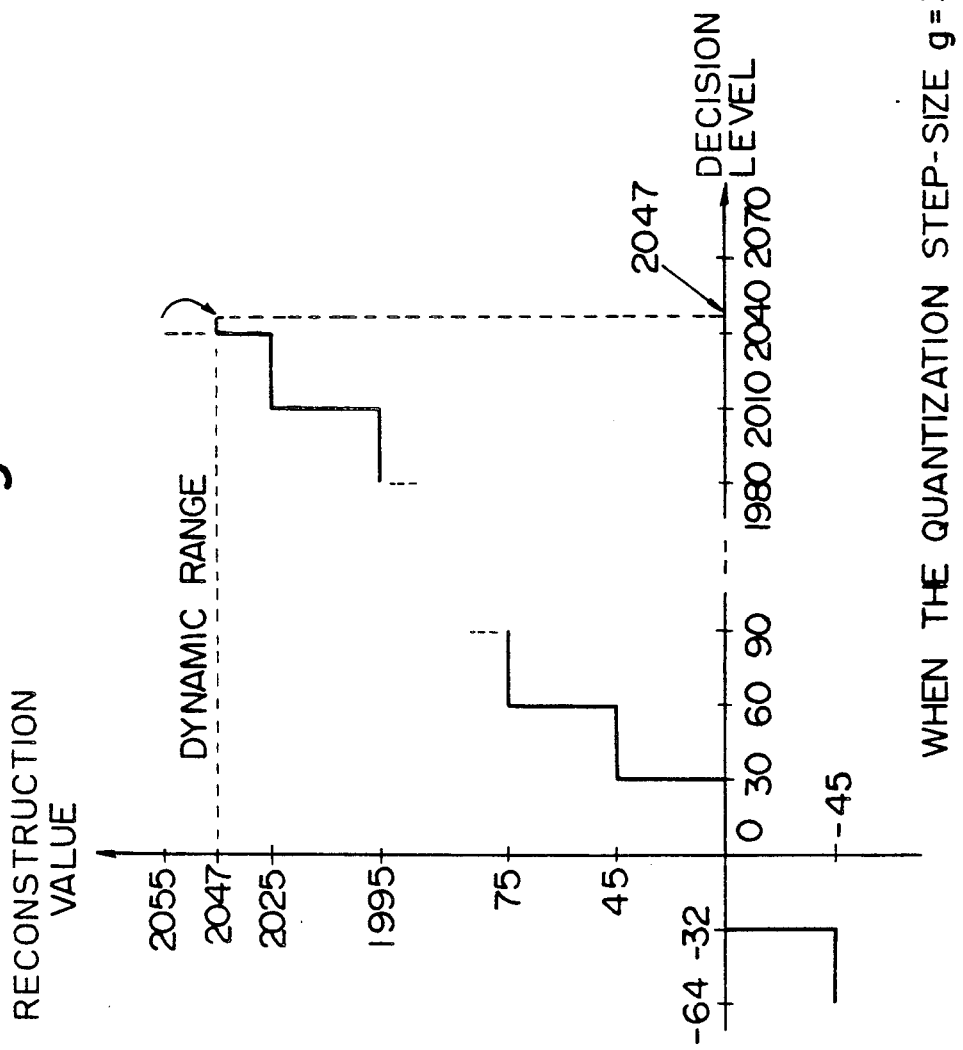
FIG. 4 is a chart illustrating a characteristic of a limiter B provided in a quantization decoding module or a local quantization decoding module according to the present invention.

An operation of the limiter B provided in the quantization decoding module depicted also in FIG. 1 will be described with reference to FIG. 2. Inputted to the limiter B 13 is a decode transform coefficient 112 conceived as an output signal from a quantization decoder 5 of the decoding module. If a value thereof exceeds the allowable dynamic range, the value is restricted to fall within a dynamic range of the transform coefficient. A transform coefficient 118 thus restricted is then outputted. In accordance with a second embodiment shown in FIG. 2, instead of the limiter A of the quantization coding module depicted in FIG. 1, a decode transform coefficient 107 of the quantization decoder 5 is restricted within the allowable dynamic range by the limiter B 13 in the local quantization decoding module. A transform coefficient 117 thus restricted is outputted. Namely, in the limiter B, as illustrated in FIG. 4, when the quantization step-size g is 30, the transform coefficient ranging from 2040 to 2047 is outputted as a numeric value of 2047. FIG. 4 demonstrates a case where the transform coefficient is positive. In the case of being negative, the transform coefficient ranging from $-2040$ to $-2048$ is similarly outputted as $-2048$.

In accordance with the first and second embodiments, the limiters are provided respectively on the transmitting and receiving sides of the system. However, the effects are, as a matter of course, exhibited by providing the limiter on one side alone.

As discussed above, according to the present invention, the limiter A or B is provided in the quantization coding module or the local quantization decoding module; or the limiter B is provided in the quantization decoding module. With this arrangement, the reconstruction value of the discrete level due to the quantization decoding does not exceed the allowable range of the input signal of the next stage; or alternatively the output signal level falls within the allowable range. This in turn prevents any operation failure from occurring when effecting the quantization decoder.

Although the illustrative embodiments of the present invention have been described in detail with reference to the accompanying drawings, it is to be understood that the present invention is not limited to those embodiments. Various changes or modifications may be effected therein by one skilled in the art without departing from the scope or the spirit of the invention.

What is claimed is:

1. In a coder for compressively transforming each of digital input signals of a finite word length by quantizing said each input signal to a discrete level while adaptively varying a quantization step-size per said digital input signal, an adaptive quantization coder comprising an quantization coding module for coding said input signal by quantizing said input signal;

a local decoding module for generating a local decode signal from a quantized value of said input signal; and a frame memory for storing said local decode signal, characterized in that said quantization coding module includes:

means for generating an initial reconstruction value of a discrete level from said quantized value of said input signal;

detecting means for detecting when said initial reconstruction value exceeds a predetermined allowable range, limiting means for generating a final reconstruction value, said final reconstruction value being equal to said initial reconstruction value when said initial reconstruction value falls within the predetermined allowable range, said final reconstruction value being limited to a discrete level closer by 1 level to an origin within said allowable range when said initial reconstruction value exceeds the predetermined allowable range.

2. The coder as set forth in claim 1, wherein said quantization coding module is composed of a transform unit for receiving and linearly transforming a difference signal between said input signal and said local decode signal, a quantizer for receiving and quantizing a signal from said transform unit, a limiter for restricting an output signal from said quantizer within a predetermined allowable range and a coding unit for receiving and coding a signal from said limiter.

3. In a coder for compressively transforming each of digital input signals of a finite word length by quantizing said each input signal to a discrete level while adaptively varying a quantization step-size per said digital input signal, an adaptive quantization coder comprising:

a quantization coding module for coding said input signal by quantizing said input signal;

a local decoding module for generating a local decode signal from a quantized value of said input signal; and a frame memory for storing said local decode signal, characterized in that said local decoding module is composed of a quantization decoder for receiving and reversely quantizing a discrete level generated after being quantized, a limiter for restricting an output signal from said quantization decoder within a predetermined allowable range and an inverse transform unit for receiving and inversely linearly transforming a signal from said limiter.

4. In a decoder for decoding a coded signal compressively transformed by quantizing each of input signals of a finite word length to a discrete level while adaptively varying a quantization step-size per said digital input signal, an adaptive quantization decoder comprising:

a quantization decoding module for generating a decode signal after receiving a coded signal; and a frame memory for storing said decode signal, characterized in that said quantization decoding module is composed of a decoding unit for receiving and decoding said coded signal, a quantization decoder for receiving and reversely quantizing a decode signal from said decoding unit, a limiter for restricting said output signal from said quantization decoder within a predetermined allowable range and an inverse transform unit for receiving and inversely transforming a signal from said limiter.

5. In an adaptive quantization coding/decoding system consisting of a coder for compressively transforming each of digital input signals of a finite word length by quantizing said each input signal to a discrete level while adaptively varying a quantization step-size per said digital input signal and a decoder for decoding a coded signal, the improvement characterized by said coder including:

a quantization coding module for coding said input signal by quantizing said input signal;

a local decoding module for generating a local decode signal from a quantized value of said input signal; and a frame memory for storing said local decode signal, said quantization coding module having means for generating an initial reconstruction value of a discrete level from said quantized value of said input signal;

detecting means for detecting when said initial reconstruction value exceeds a predetermined allowable range, limiting means for generating a final reconstruction value, said final reconstruction value being equal to said initial reconstruction value when said initial reconstruction value falls within the predetermined allowable range, said final reconstruction value being limited to a discrete level closer by 1 level to an origin within said allowable range when said initial reconstruction value exceeds the predetermined allowable range, said decoder including:

a quantization decoding module for generating a decode signal after receiving said coded signal; and a frame memory, for storing said decode signal.

6. In an adaptive quantization coding/decoding system consisting of a coder for compressively transforming each of digital input signals of a finite word length by quantizing said each input signal to a discrete level while adaptively varying a quantization step-size per said digital input signal and a decoder for decoding a coded signal, the improvement characterized by said coder including:

a quantization coding module for coding said input signal by quantizing said input signal;

a local decoding module for generating a local decode signal from a quantized value of said input signal; and a frame memory for storing said local decode signal, said local decoding unit being composed of a quantization decoder for receiving and reversely quantizing a discrete level generated after being quantized, a limiter for restricting an output signal from said quantization decoder within a predetermined allowable range and an inverse transform unit for receiving and inversely linearly transforming a signal from said limiter, said decoder including:

a quantization decoding module for generating a decode signal after receiving said coded signal; and a frame memory for storing said decode signal, said quantization decoding module is composed of a decoding unit for receiving and decoding said coded signal, a quantization decoder for receiving and reversely quantizing a decode signal from said decoding unit, a limiter for restricting said output signal from said quantization decoder within a predetermined allowable range and an inverse transform unit for receiving and inversely transforming a signal from said limiter.

* * * * *